United States Patent
Dunn

[19]

[11] Patent Number: 5,936,882
[45] Date of Patent: Aug. 10, 1999

[54] MAGNETORESISTIVE RANDOM ACCESS MEMORY DEVICE AND METHOD OF MANUFACTURE

[75] Inventor: William Charles Dunn, Mesa, Ariz.

[73] Assignee: Motorola, Inc., Schaumburg, Ill.

[21] Appl. No.: 09/053,900

[22] Filed: Mar. 31, 1998

[51] Int. Cl.[6] .................................................. G11C 11/00
[52] U.S. Cl. .......................... 365/158; 365/157; 365/170; 365/171; 365/173
[58] Field of Search .................................. 365/158, 171, 365/170, 173, 157

[56] References Cited

U.S. PATENT DOCUMENTS

| | | | |
|---|---|---|---|
| 4,722,073 | 1/1988 | Lampe et al. | 365/158 |
| 5,173,873 | 12/1992 | Wu et al. | 365/173 |
| 5,295,097 | 3/1994 | Lienau | 365/170 |
| 5,329,480 | 7/1994 | Wu et al. | 365/170 |
| 5,343,422 | 8/1994 | Kung et al. | 365/173 |
| 5,361,226 | 11/1994 | Taguchi et al. | 365/171 |
| 5,396,455 | 3/1995 | Brady et al. | 365/170 |
| 5,448,515 | 9/1995 | Fukami et al. | 365/171 |
| 5,477,482 | 12/1995 | Prinz | 365/129 |
| 5,640,343 | 6/1997 | Gallagher et al. | 365/171 |
| 5,699,293 | 12/1997 | Tehrani et al. | 365/158 |
| 5,734,605 | 3/1998 | Zhu et al. | 365/173 |
| 5,734,606 | 3/1998 | Tehrani et al. | 365/173 |
| 5,748,519 | 5/1998 | Tehrani et al. | 365/170 |
| 5,852,574 | 12/1998 | Naji | 365/158 |

OTHER PUBLICATIONS

"1–Mb Memory Chip Using Giant Magnetoresistive Memory Cells" by J.L. Brown, Member IEEE and A.V. Pohm, Fellow, IEEE.

*Primary Examiner*—David Nelms
*Assistant Examiner*—Gene N. Auduong
*Attorney, Agent, or Firm*—Anthony M. Martinez; Rennie William Dover

[57] ABSTRACT

A Magnetoresistive Random Access Memory (MRAM) device (10) and a method for manufacturing the MRAM device (10). The MRAM device (10) has a plurality of pairs of sense lines (21A, 21B, 22A, 22B, 23A, 23B, 24A, 24B), a plurality of pairs of memory cells (51A, 51B), and a plurality of word lines (31, 32, 33, 34). For two adjacent sense lines (21A, 22A), a first end of the first sense line (21A) is placed adjacent to a second end of the second sense line (22A) and a second end of the first sense line (21A) is placed adjacent to a first end of the second sense line (22A). Decoding transistors (82, 83, 84, 85, 86, 87, 88, 89) are connected to the second ends of the plurality of pairs of sense lines (21A, 21B, 22A, 22B, 23A, 23B, 24A, 24B).

17 Claims, 3 Drawing Sheets

MAGNETORESISTIVE RANDOM ACCESS MEMORY DEVICE AND METHOD OF MANUFACTURE

FIELD OF THE INVENTION

The present invention relates, in general, to random access memory devices and, more particularly, to magnetoresistive random access memory devices.

BACKGROUND OF THE INVENTION

Computer systems use Random Access Memories (RAMs) such as Dynamic RAM (DRAM) and Static RAM (SRAM) to store information. Generally, the DRAM has high speed read/write cycle time characteristics; however, it requires repeated replenishing of charge stored on the capacitors in order to retain the information. The SRAM stores information in flip-flop elements typically made up of four to six transistors. Both DRAM and SRAM are volatile memory devices.

A Magnetoresistive RAM (MRAM) device has been developed as a new type of memory, which is non-volatile. The MRAM has a plurality of memory cells. Each memory cell is a multilayered structure in which two layers of magnetic material are separated by a layer of non-magnetic metallic conducting material. Digital information is represented by the direction of magnetic vectors in the magnetic material. The information remains in a given state until it is intentionally changed by applying an opposite magnetic field that exceeds a threshold level.

In the prior art MRAM devices, a comparator is used for retrieving the digital information stored in the memory cells of the MRAM devices. To read the digital information stored in the memory cells, the comparator is initially "autozeroed." A problem with having an "autozero" step for retrieving digital information is that it increases the amount of time for the reading of the digital information, which decreases the overall speed of the MRAM device.

Accordingly, it would be advantageous to have an MRAM device and method for high speed operation of the device. It would be of further advantage for the MRAM device to have a high density, i.e., occupy a small area.

DETAILED DESCRIPTION OF THE DRAWINGS

Generally, the present invention provides a Magnetoresistive Random Access Memory (MRAM) device and a method for manufacturing the MRAM device. The MRAM device has a plurality of sense lines, where each sense line has two ends. In accordance with the present invention, the plurality of sense lines are formed adjacent to each other. Further, for two adjacent sense lines, the first end of the first sense line is adjacent to the second end of the second sense line and the second end of the first sense line is adjacent to the first end of the second sense line. The second end of each sense line is connected to a sense line decoding transistor. Forming the sense lines of the MRAM device and the corresponding sense line decoding transistors in this fashion allows for placing the decoding transistors underneath the plurality of sense lines of the MRAM device. This results in an MRAM device that has a high density compared to prior art MRAM devices.

Figure 1:
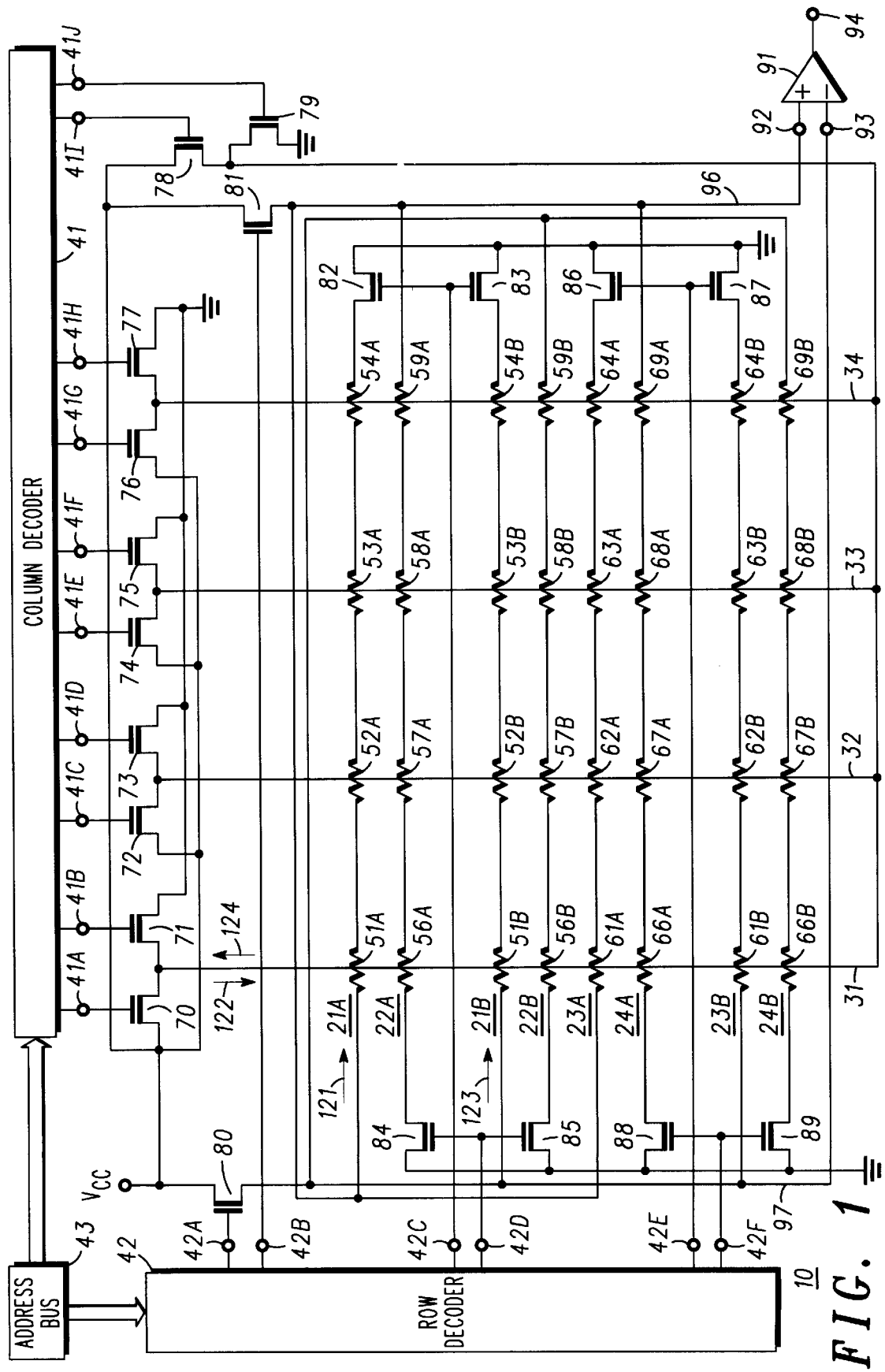
FIG. 1 is a schematic diagram of a portion of an MRAM device in accordance with a first embodiment of the present invention.

FIG. 1 is a schematic diagram of a portion of an MRAM device 10 in accordance with a first embodiment of the present invention. MRAM device 10 has a plurality of pairs of sense lines 21A–24A and 21B–24B perpendicular to a plurality of word lines 31–34. The letters "A" and "B" are appended to numbers 21–24 to denote the pairing of the sense lines. For example, sense line 21A is paired with sense line 21B. Sense lines 21B–24B are referred to as reference sense lines or matching sense lines.

MRAM device 10 also has a plurality of memory cells 51A, 52A, 53A, 54A, 56A, 57A, 58A, 59A, 51B, 52B, 53B, 54B, 56B, 57B, 58B, 59B, 61A, 62A, 63A, 64A, 66A, 67A, 68A, 69A, 61B, 62B, 63B, 64B, 66B, 67B, 68B, and 69B. Each sense line 21A–24A and 21B–24B overlies portions of the memory cells. For example, sense line 21A overlies portions of memory cells 51A, 52A, 53A, and 54A and sense line 22A overlies portions of memory cells 56A, 57A, 58A, and 59A. In addition, matching sense line 21B overlies portions of memory cells 51B, 52B, 53B, and 54B and matching sense line 22B overlies portions of memory cells 56B, 57B, 58B, and 59B. Sense line 23A overlies portions of memory cells 61A, 62A, 63A, and 64A and sense line 24A overlies portions of memory cells 66A, 67A, 68A, and 69A. Matching sense line 23B overlies portions of memory cells 61B, 62B, 63B, and 64B and matching sense line 24B overlies portions of memory cells 66B, 67B, 68B, and 69B.

Current is selectively provided to the plurality of word lines and the plurality of sense lines using a column decoder 41 and a row decoder 42, both of which have inputs that are connected to an address bus 43. In addition, column decoder 41 is connected to a plurality of switching transistors 70–79 and row decoder 42 is connected to a plurality of switching transistors 80–89. By way of example, the switching transistors of MRAM device 10 are Field Effect Transistors (FETs), each having a gate electrode, a drain electrode, and a source electrode. Although switching transistors 70–89 are described as FETs, this is not a limitation of the present invention. Switching transistors 70–89 can be bipolar transistors. It should be noted that the gate electrode of a FET is referred to as a control electrode and the drain and source electrodes of a FET are referred to as current carrying electrodes. Likewise, the base electrode of a bipolar transistor is referred to as a control electrode and the collector and emitter electrodes of a bipolar transistor are referred to as current carrying electrodes.

Column decoder 41 has a plurality of outputs 41A–41J. Outputs 41A–41J are connected to the gate electrodes of FETs 70–79, respectively. The drain electrodes of FETS 70 and 71 are connected to the first end of word line 31. Likewise, the drain electrodes of FETs 72 and 73 are connected to the first end of word line 32; the drain electrodes of FETs 74 and 75 are connected to the first end of word line 33; and the drain electrodes of FETs 76 and 77 are connected to the first end of word line 34. The source electrodes of FETs 70, 72, 74, and 76 are coupled for receiving a power supply voltage or source of operating potential such as, for example, voltage Vcc. The source electrodes of FETs 71, 73, 75, and 77 are coupled for receiving a power supply voltage such as, for example, ground. The source electrode of FET 78 is coupled for receiving a power supply voltage such as, for example, voltage Vcc, and the source electrode of FET 79 is coupled for receiving a power supply voltage such as, for example, ground. The drain electrodes of FETs 78 and 79 are commonly connected to each other and to the second ends of word lines 31, 32, 33, and 34.

Row decoder 42 has a plurality of outputs 42A–42F. Outputs 42A and 42B are connected to the gate electrodes of FETs 80 and 81, respectively. Output 42C is commonly connected to the gate electrodes of FETs 82 and 83; output 42D is commonly connected to the gate electrodes of FETs 84 and 85; output 42E is commonly connected to the gate electrodes of FETs 86 and 87; and output 42F is commonly connected to the gate electrodes of FETs 88 and 89. The source electrodes of FETs 80 and 81 are coupled for receiving a power supply voltage such as, for example, voltage Vcc. The drain electrode of FET 80 is commonly connected to the first ends of matching sense lines 21B–24B and the drain electrode of FET 81 is commonly connected to the first ends of sense lines 21A–4A. The source electrodes of FETs 82–89 are coupled for receiving a power supply voltage such as, for example, ground. The drain electrodes of FETs 82, 83, 84, 85, 86, 87, 88, and 89 are connected to the second ends of sense lines 21A, 21B, 22A, 22B, 23A, 23B, 24A, and 24B, respectively.

Sense lines 21A–24A and matching sense lines 21B–24B are connected to a differential sense amplifier 91. More particularly, the first ends of sense lines 21A–24A are commonly connected to a positive input 92 of differential sense amplifier 91 by an interconnect 96 and the first ends of matching sense lines 21B–24B are commonly connected to a negative input 93 of differential sense amplifier 91 by an interconnect 97. Differential sense amplifier 91 has an output 94.

Figure 2:
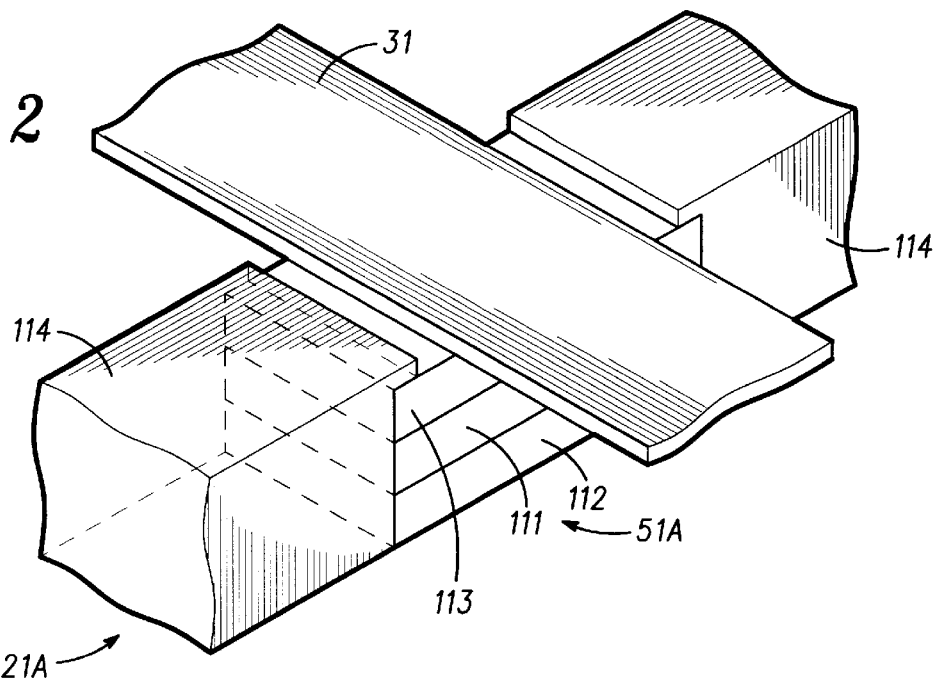
FIG. 2 is an isometric view of a memory cell of the MRAM device of FIG. 1.

FIG. 2 is an isometric view of memory cell 51A. Memory cell 51A is comprised of an electrically conductive layer 111 disposed between two magnetic layers 112 and 113. In other words, conductive layer 111 is formed on magnetic layer 112 and magnetic layer 113 is formed on conductive layer 111. It should be understood that the same reference numerals are used in the figures to denote the same elements. Conductive layer 111 is comprised of an electrically conductive material such as, for example, copper, aluminum, or the like. Magnetic layers 112 and 113 are comprised of magnetic materials such as, for example, Nickel-Iron (NiFe), Nickel-Iron-Cobalt (NiFeCo), or the like. Together, conductive layer 111 and magnetic layers 112 and 113 form a Giant MagnetoResistive (GMR) material. Word line 31, which carries a word current, is placed adjacent to magnetic layer 113. The word current generates a magnetic field that is applied to the GMR material of memory cell 51A. Memory cell 51A is connected to peripheral circuitry by a conductive material 114 such as, for example, copper, aluminum, or the like. A sense current flows through sense line 21A and generates a magnetic field that combines with the magnetic field generated by the word current of word line 31 to form a total magnetic field. When applied to magnetic layers 112 and 113, the total magnetic field partially switches the direction of the magnetic vectors in magnetic layers 112 and 113. By partially switching the magnetic vectors in magnetic layers 112 and 113, the information stored in magnetic layers 112 and 113 is not destroyed. This is known as a non destructive read. The resistance of sense line 21A changes according to the direction of the magnetic vectors of magnetic layers 112 and 113.

Binary bits having logic values of logic "0" or logic "1" are stored or written to memory cell 51A by applying a total magnetic field. The logic value of the binary bit stored in memory cell 51A is read or retrieved by measuring or sensing the resistance of sense line 21A. In addition, the logic value of the binary bit stored in memory cell 51A can be retrieved by sensing the voltage of sense line 21A.

Referring again to FIG. 1, applying sense current to a sense line causes heating of the sense line that alters the resistance of the sense line. Altering the resistance of a sense line in this fashion is undesirable since resistance is used for determining the information stored in a memory cell. Therefore, a differential sensing technique is used for eliminating problems associated with heating or temperature effects of the sense lines. Each sense line has a matching sense line, which is its paired sense line, and uses differential sense amplifier 91 for canceling the temperature effects of the sense lines. In addition, each memory cell is paired or matched with a matching memory cell. For example, memory cell 51B is paired with memory cell 51A and is therefore referred to as a matching memory cell.

Bits having opposite or complementary logic values are stored in a pair of memory cells. For example, if a logic "1" is stored in memory cell 51A, then a logic "0" is preferably stored in matching memory cell 51B. To retrieve the information stored in memory cells 51A and 51B, the voltage of sense line 21A is transmitted to positive input 92 and the voltage of matching sense line 21B is transmitted to negative input 93. Differential sense amplifier 91 generates a difference voltage by subtracting the voltage of matching sense line 21B from the voltage of sense line 21A. In addition, the difference voltage is amplified and transmitted to output 94. Using this method for storing and retrieving information results in doubling of the output signal compared to using a single sense line and a single memory cell for storing and retrieving information.

The plurality of switching transistors of MRAM device 10 induce noise, capacitive coupling, and other transients in the plurality of sense lines of MRAM device 10. The effects of the noise, capacitive coupling, and transients are canceled by using the differential sensing technique described hereinbefore.

The difference voltage at output 94 is used to determine the binary logic values stored in a pair of memory cells. For example, the difference voltage at output 94 has two voltage values. If a logic "1" is stored in memory cell 51A and a complementary logic value of logic "0" is stored in memory cell 51B, then the difference voltage at output 94 has a first voltage value when the voltages of sense lines 21A and 21B are sensed by differential sense amplifier 91. Conversely, if a logic "0" is stored in memory cell 51A and a complementary logic value of logic "1" is stored in memory cell 51B, then the difference voltage at output 94 has a second voltage value when the voltages of sense lines 21A and 21B are sensed by differential sense amplifier 91.

Each pair of memory cells is defined as having a binary state. For example, memory cells 51A and 51B are defined as having a binary state of logic "1" when a logic "1" is stored in memory cell 51A and a logic "0" is stored in memory cell 51B. Alternatively, memory cells 51A and 51B are defined as having a binary state of logic "0" when a logic "0" is stored in memory cell 51A and a logic "1" is stored in memory cell 51B. It should be understood that the definitions of logic "0" and logic "1" for the binary state of a pair of memory cells are a matter of choice. In other words, a binary state of logic "1" can be defined as being when a logic "0" is stored in memory cell 51A and a logic "1" is stored in memory cell 51B.

By way of example, a beginning step for storing a logic "1" in memory cell 51A includes providing an address for the locations of memory cells 51A and 51B to column decoder 41 and row decoder 42 through address bus 43. Row decoder 42 provides a turn-on signal to the gate electrodes of FETs 82 and 83 from output 42C, which turns on FETs 82 and 83. Row decoder 42 provides a turn-on signal from output 42B to the gate electrode of transistor 81, thereby turning on transistor 81. When transistors 81 and 82 turn on, a sense current, indicated by an arrow 121, flows through sense line 21A. Column decoder 41 provides turn-on signals to the gate electrodes of FETs 70 and 79 from outputs 41A and 41J, respectively, thereby turning on FETs 70 and 79. When transistors 70 and 79 turn on, a word current, indicated by an arrow 122, flows through word line 31. The magnetic field generated by the word current (indicated by arrow 122) combines with the magnetic field generated by the sense current (indicated by arrow 121) to generate a total magnetic field for storing a logic "1" in memory cell 51A. After the logic "1" is stored in memory cell 51A, the sense current indicated by arrow 121 is removed from sense line 21A by turning off transistors 81 and 82. In addition, the word current indicated by arrow 122 is removed from word line 31 by turning off transistors 70 and 79.

Preferably, a complementary logic value of logic "0" is stored in memory cell 51B since a logic "1" is stored in memory cell 51A. A beginning step for storing the logic "0" in memory cell 51B includes providing a turn-on signal to the gate electrodes of FETs 82 and 83 from output 42C. Transistor 80 is turned on by row decoder 42 providing a turn-on signal to the gate electrode of transistor 80 from output 42A. When transistors 80 and 83 turn on, a sense current (indicated by an arrow 123) flows through sense line 21B. Column decoder 41 turns on FETs 71 and 78 by providing turn-on signals to the gate electrodes of FETs 71 and 78 from outputs 41B and 41I, respectively. When transistors 71 and 78 turn on, a word current, indicated by an arrow 124, flows through word line 31. The magnetic field generated by the sense current (indicated by arrow 123) combines with the magnetic field generated by the word current (indicated by arrow 124) to generate a total magnetic field for storing a logic "0" in memory cell 51B. It should be noted that the word current (indicated by arrow 122) flows in an opposite direction in word line 31 compared to the word current (indicated by arrow 124) for storing complementary logic values in memory cells 51A and 51B.

In order to read the binary state of memory cells 51A and 51B, an address for the locations of memory cells 51A and 51B is provided through address bus 43 to column decoder 41 and row decoder 42. Row decoder 42 provides turn-on signals to the gate electrodes of FETs 80, 81, 82, and 83 to generate the sense currents indicated by arrows 121 and 123. In addition, column decoder 41 provides turn-on signals to the gate electrodes of FETs 70 and 79 to generate the word current indicated by arrow 122. In order to perform a non destructive read of memory cells 51A and 51B, the word current (indicated by arrow 122) for retrieving the binary state of memory cells 51A and 51B is less than the word current for writing the binary state of memory cells 51A and 51B. The sense current indicated by arrow 121 combines with the word current indicated by arrow 122 to generate a total magnetic field that is applied to memory cell 51A and the sense current indicated by arrow 123 combines with the word current indicated by arrow 122 to generate a total magnetic field that is applied to memory cell 51B. The voltages of sense lines 21A and 21B are provided to inputs 92 and 93 of differential sense amplifier 91, respectively. Differential sense amplifier 91 generates a difference voltage by subtracting the voltage of matching sense line 21B from the voltage of sense line 21A. In addition, the difference voltage is amplified and provided to output 94 for determining the binary state of memory cells 51A and 51B.

In the "read" mode of operation, the contents of a pair of memory cells are evaluated and compared at the same time to determine the binary state stored in the pair of memory cells. For example, when retrieving the binary state of memory cells 51A and 51B, the word current indicated by arrow 122 and the sense currents indicated by arrows 121 and 123 are preferably applied during a single read cycle. In addition, the difference voltage at output 94 is preferably generated by differential sense amplifier 91 during the same single read cycle. Since the binary state of a pair of memory cells is retrieved during a single read cycle and without using an "autozero" step, the present invention is a high speed MRAM device.

The method described hereinbefore for storing and retrieving information to and from memory cells 51A and 51B is applied to other pairs of memory cells of MRAM device 10 for storing and retrieving information to and from these pairs of memory cells. Switching transistors 82, 83, 84, 85, 86, 87, 88, and 89 are also referred to as sense line decoding transistors since these transistors are used to select a pair of sense lines. In addition, switching transistors 80 and 81 are referred to as sense line driving transistors since these transistors are used to provide current to the plurality of sense lines of MRAM device 10. It should be noted that switching transistors 80 and 81 are used for regulation of the sense line currents to ensure that the same amount of current is provided to a pair of sense lines. Similarly, switching transistors 78 and 79 are used for regulation of the word line currents to ensure that the same amount of current is provided to a each word line.

Figure 3:
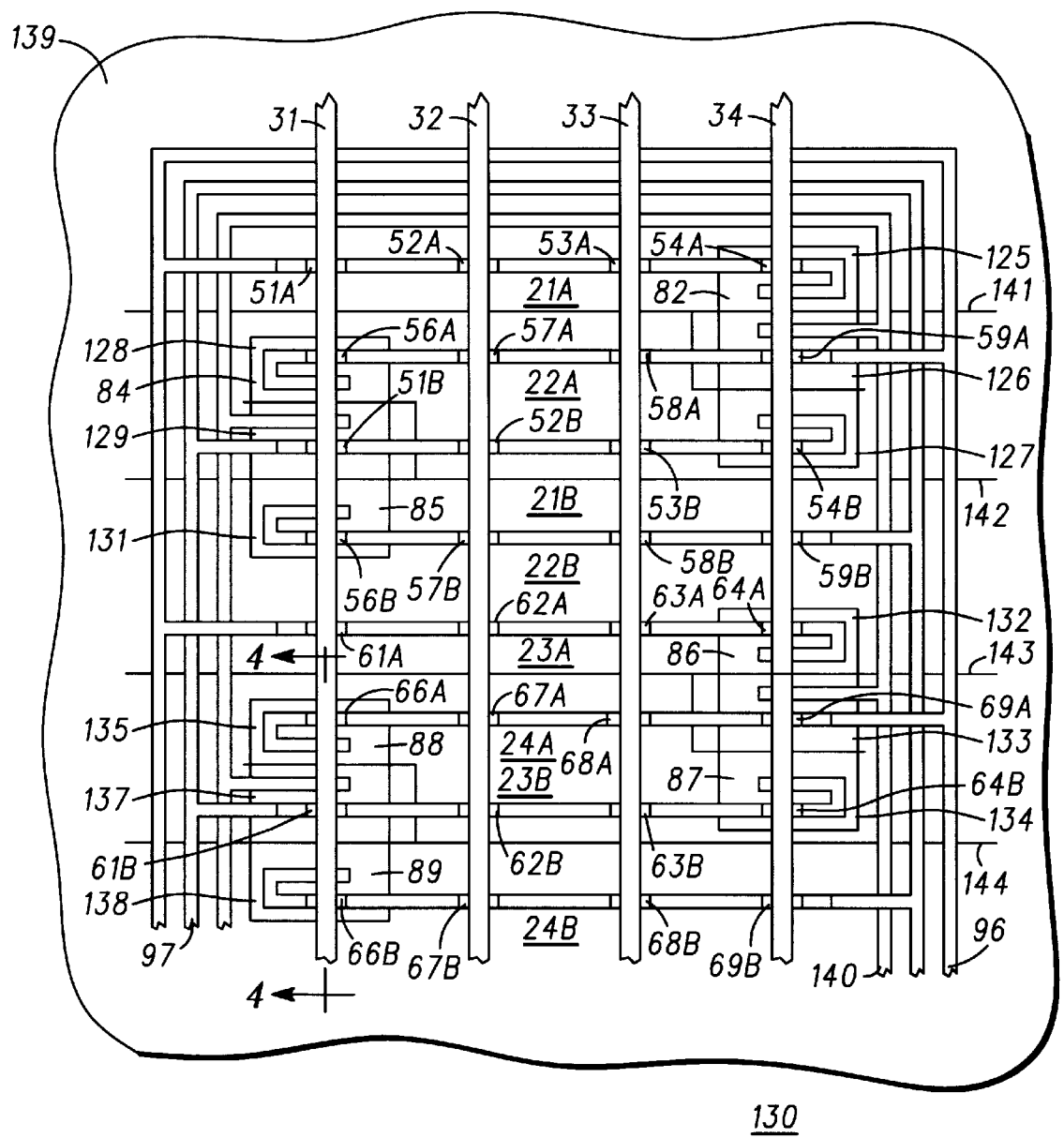
FIG. 3 is a top view of a layout of a portion of the MRAM device of FIG. 1.

FIG. 3 is a top view of a layout 130 of a portion of MRAM device 10. It should be understood that the same reference numerals are used in the figures to denote the same elements. For illustration purposes, layout 130 is shown without the oxide material that is present in MRAM device 10. In particular, FIG. 3 illustrates word lines 31–34 overlying sense lines 21A–24A and matching sense lines 21B–24B. Further, word line 31 overlies memory cells 51A, 56A, 51B, 56B, 61A, 66A, 61B, and 66B. In addition, word line 32 overlies memory cells 52A, 57A, 52B, 57B, 62A, 67A, 62B, and 67B; word line 33 overlies memory cells 53A, 58A, 53B, 58B, 63A, 68A, 63B, and 68B; and word line 34 overlies memory cells 54A, 59A, 54B, 59B, 64A, 69A, 64B, and 69B. FIG. 3 further illustrates the first ends of sense lines 21A–24A connected to interconnect 96 and the first ends of matching sense lines 21B–24B connected to interconnect 97. Interconnects 96 and 97 are also referred to as interconnects. Interconnects 96 and 97 and word lines 31–34 are formed of a conductive material such as, for example, copper, aluminum, or the like.

In accordance with a method of the present invention, the plurality of sense lines of MRAM device 10 are formed adjacent to each other. For two adjacent sense lines, the first end of the first sense line is adjacent to the second end of the second sense line and the second end of the first sense line is adjacent to the first end of the second sense line. For example, sense line 21A is adjacent to sense line 22A, the first end of sense line 21A is adjacent to the second end of sense line 22A, and the second end of sense line 21A is adjacent to the first end of sense line 22A. Forming the plurality of sense lines of MRAM device 10 in this fashion enables decoding transistors 82–89 to be formed underneath the plurality of sense lines of MRAM device 10.

Layout 130 further illustrates an interconnect 140, gate interconnects 141, 142, 143, and 144, and doped regions 125, 126, 127, 128, 129, 131, 132, 133, 134, 135, 137, and 138 formed in a substrate 139. Interconnect 140 is formed of a conductive material such as, for example, copper and gate interconnects 141, 142, 143, and 144 are formed of a conductive material such as, for example, polysilicon. Doped regions 125, 126, 127, 128, 129, 131, 132, 133, 134, 135, 137, and 138, substrate 139, interconnect 140, and gate interconnects 141, 142, 143, and 144 cooperate to form decoding transistors 82–89 underneath the plurality of memory cells of MRAM device 10.

Figure 4:
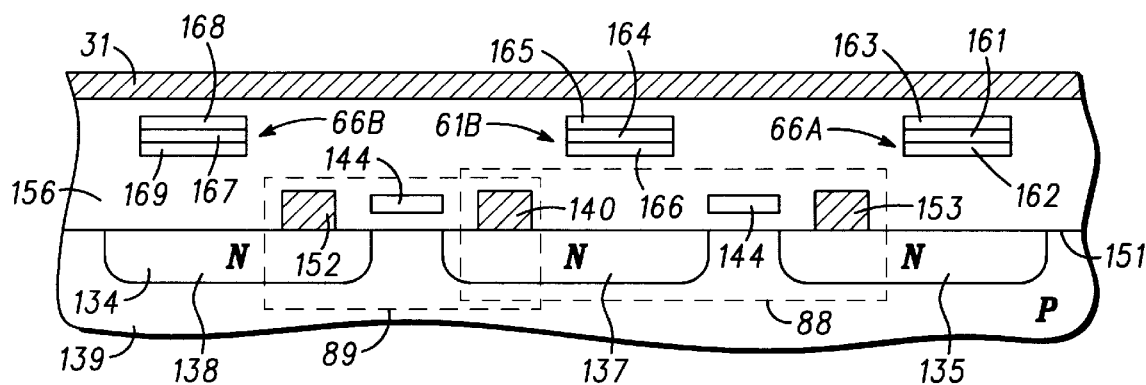
FIG. 4 is a cross-sectional view of the layout of FIG. 3 taken along section line 4—4.

FIG. 4 is a cross-sectional view of layout 130 taken along section line 4—4. What is shown in FIG. 4 is substrate 139 having a surface 151. By way of example, substrate 139 is a semiconductor material and is lightly doped with an impurity material of P conductivity type. Substrate 139 has a doping concentration ranging between approximately $10^{14}$ atoms per cubic centimeter (atoms/cm$^3$) and approximately $10^{16}$ atoms/cm$^3$. Doped regions 138, 137, and 135 extend vertically from surface 151 into substrate 139 and are spaced apart from each other. Doped regions 138, 137, and 135 are each preferably formed by diffusing an N type impurity material such as, for example, phosphorus, into substrate 139. Doped regions 138, 137, and 135 each has a doping concentration ranging between approximately $10^{16}$ atoms/cm$^3$ and approximately $10°$ atoms/cm$^3$.

Gate interconnect 144 forms the gate electrodes of transistors 88 and 89 and interconnect 140 forms the source electrodes of transistors 88 and 89. The drain electrodes 152 and 153 of transistors 88 and 89 are formed by the second ends of sense lines 24A and 24B (not shown in FIG. 4), respectively.

An oxide 156 is formed on surface 151 and between gate interconnect 144, interconnect 140, word line 31, drain electrodes 152 and 153, and memory elements 66A, 61B, and 66B. The structure of memory elements 66A, 61B, and 66B is similar to the structure of memory element 51A described with reference to FIG. 2. For example, memory cell 66B has a conductive layer 167 disposed between two magnetic layers 168 and 169. Similarly, memory cell 61B has a conductive layer 164 disposed between two magnetic layers 165 and 166 and memory cell 66A has a conductive layer 161 disposed between two magnetic layers 162 and 163.

By manufacturing MRAM device 10 as shown in FIG. 3, decoding transistors 82–89 are formed underneath the plurality of the memory cells of MRAM device 10 leaving a portion of MRAM device 10 available for metalization of the source electrodes and the drain electrodes of decoding transistors 82–89. Metalizing the source and drain electrodes of decoding transistors 82–89 reduces the source to drain "on" resistance of transistors 82–89 and reduces the overall impedances of sense lines 21A–24A and 21B–24B. In addition, the density of MRAM device 10 is limited by the size of the memory cells and not the size of the switching transistors.

Figure 5:
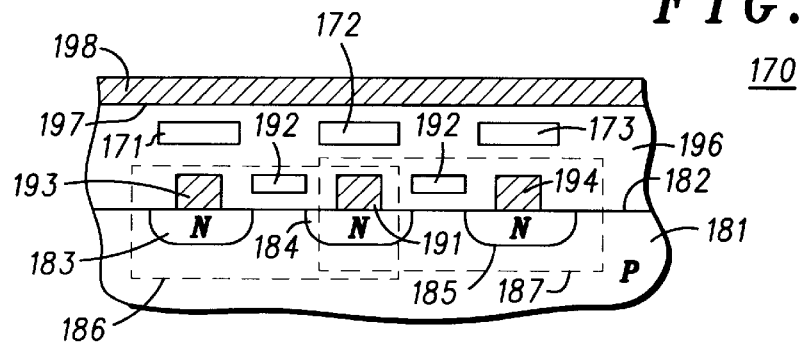
FIG. 5 is a cross-sectional view of an MRAM device in accordance with a second embodiment of the present invention.

FIG. 5 is a cross-sectional view of an MRAM device 170 in accordance with a second embodiment of the present invention. MRAM device 170 has a higher density compared to MRAM device 10 of FIG. 1. MRAM device 170 has memory cells 171, 172, and 173 and is formed on a substrate 181 having a surface 182. For purposes of clarity, the structures of memory cells 171, 172, and 173 are not shown. Substrate 181 is a semiconductor material that is lightly doped with an impurity material of P conductivity type. Substrate 181 has a doping concentration ranging between approximately $10^{14}$ atoms/cm$^3$ and approximately $10^{16}$ atoms/cm$^3$. Doped regions 183, 184, and 185 extend vertically from surface 182 into substrate 181. Doped regions 183, 184, and 185 are each preferably formed by diffusing an N type impurity material into substrate 181. Doped regions 183, 184, and 185 each has a doping concentration ranging between approximately $10^{16}$ atoms/cm$^3$ and approximately $10^{20}$ atoms/cm$^3$.

Sense line decoding transistors 186 and 187 are formed using doped region 183 and substrate 181. A conductive material 191 forms the source electrodes of transistors 186 and 187 and a polysilicon material 192 forms the gate electrodes of transistors 186 and 187. The drain electrodes of transistors 186 and 187 are formed by conductive materials 193 and 194, respectively. An oxide material 196 having a surface 197 is formed on surface 182 and between memory cells 171, 172, and 173, conductive materials 191, 193, and 194, and polysilicon material 192. A conductive material 198 is formed on a portion of surface 197.

MRAM device 170 has a higher density than MRAM device 10 because the drain electrodes of transistors 186 and 187 are directly underneath memory cells 171 and 173, respectively. In other words, conductive materials 193 and 194 are formed directly underneath memory cells 171 and 173, respectively. In addition, conductive material 191 is formed directly underneath memory cell 172.

By now it should be appreciated that an MRAM device and a method for manufacturing the MRAM device have been provided. An advantage of the present invention is that it provides an MRAM device having a high density by manufacturing the MRAM device with its sense line decoding transistors underneath its memory elements. Another advantage of the present invention is that it provides an MRAM device and a method for retrieving digital information from the MRAM device without using an "autozero" step. Further, the present invention is compatible with standard semiconductor processing techniques.

What is claimed is:

1. A Magnetoresistive Random Access Memory (MRAM) device, comprising:

a first memory cell;

a second memory cell;

a first sense line having a first end and a second end, wherein the first sense line overlies a portion of the first memory cell;

a second sense line having a first end adjacent to the second end of the first sense line and a second end adjacent to the first end of the first sense line, wherein the second sense line overlies a portion of the second memory cell;

a first decoding transistor having a current carrying electrode coupled to the second end of the first sense line and a control electrode; and a second decoding transistor having a current carrying electrode coupled to the second end of the second sense line and a control electrode.

2. The MRAM device of claim 1, further comprising:

a third memory cell;

a fourth memory cell;

a third sense line having a first end adjacent to the second end of the second sense line and a second end adjacent to the first end of the second sense line, wherein the third sense line overlies a portion of the third memory cell and wherein the second sense line is between the first sense line and the third sense line; and a fourth sense line having a first end adjacent to the second end of the third sense line and a second end adjacent to the first end of the third sense line, wherein the fourth sense line overlies a portion of the fourth memory cell and wherein the third sense line is between the second sense line and the fourth sense line.

3. The MRAM device of claim 2, wherein the third sense line is a matching sense line and is paired with the first sense line.

4. The MRAM device of claim 2, wherein the fourth sense line is a matching sense line and is paired with the second sense line.

5. The MRAM device of claim 2, wherein the third memory cell is a matching memory cell and is paired with the first memory cell.

6. The MRAM device of claim 2, further comprising:
a first driving transistor having a current carrying electrode coupled to the first end of the third sense line and the first end of the fourth sense line and a control electrode; and
a second driving transistor having a current carrying electrode coupled to the first end of the first sense line and the first end of the second sense line and a control electrode.

7. The MRAM device of claim 2, further comprising:
a third decoding transistor having a current carrying electrode coupled to the second end of the third sense line and a control electrode coupled to the control electrode of the first decoding transistor; and
a fourth decoding transistor having a current carrying electrode coupled to the second end of the fourth sense line and a control electrode coupled to the control electrode of the second decoding transistor.

8. The MRAM device of claim 7, wherein the first decoding transistor, the second decoding transistor, the third decoding transistor, and the fourth decoding transistor are Field Effect Transistors (FETs).

9. The MRAM device of claim 7, wherein the first decoding transistor, the second decoding transistor, the third decoding transistor, and the fourth decoding transistor are formed underneath the first sense line, the second sense line, the third sense line, and the fourth sense line.

10. The MRAM device of claim 2, further comprising a differential sense amplifier having a first input coupled to the first end of the first sense line and the first end of the second sense line, a second input coupled to the first end of the third sense line and the first end of the fourth sense line, and an output.

11. The MRAM device of claim 2, further comprising a word line having a first end and a second end, wherein the word line overlies the first memory cell, the second memory cell, the third memory cell, and the fourth memory cell.

12. The MRAM device of claim 11, further comprising:
a first transistor having a first current carrying electrode coupled to the first end of the word line, a second current carrying electrode coupled for receiving a second source of operating potential, and a control electrode;
a second transistor having a first current carrying electrode coupled to the first end of the word line, a second current carrying electrode coupled for receiving a first source of operating potential, and a control electrode;

a third transistor having a first current carrying electrode coupled to the second end of the word line, a second current carrying electrode coupled for receiving the first source of operating potential, and a control electrode; and
a fourth transistor having a first current carrying electrode coupled to the second end of the word line, a second current carrying electrode coupled for receiving the second source of operating potential, and a control electrode.

13. The MRAM device of claim 1, wherein the first memory cell comprises:
a first magnetic layer;
a conductive layer formed on the first magnetic layer; and
a second magnetic layer formed on the conductive layer.

14. The MRAM device of claim 13, wherein the first and second magnetic layers are formed of a material selected from the group consisting of Nickel-Iron (NiFe) and Nickel-Iron-Cobalt (NiFeCo), and wherein the conductive layer is copper.

15. A Random Access Memory (RAM) device, comprising:
a first memory cell;
a second memory cell;
a first sense line having a first end and a second end, wherein the first sense line overlies a portion of the first memory cell;
a second sense line having a first end adjacent to the second end of the first sense line and a second end adjacent to the first end of the first sense line, wherein the second sense line overlies a portion of the second memory cell; and
a word line having a first end and a second end, wherein the word line overlies the first memory cell, the second memory cell, the first sense line, and the second sense line.

16. The RAM device of claim 15, further comprising:
a third memory cell;
a fourth memory cell;
a third sense line having a first end adjacent to the second end of the second sense line and a second end adjacent to the first end of the second sense line, wherein the third sense line overlies a portion of the third memory cell and wherein the second sense line is between the first sense line and the third sense line; and
a fourth sense line having a first end adjacent to the second end of the third sense line and a second end adjacent to the first end of the third sense line, wherein the fourth sense line overlies a portion of the fourth memory cell and wherein the word line overlies the third memory cell, the fourth memory cell, the third sense line, and the fourth sense line.

17. The RAM device of claim 16, further comprising:
a first decoding transistor having a first current carrying electrode coupled to the second end of the first sense line, a second current carrying electrode coupled for receiving a source of operating potential, and a control electrode;
a second decoding transistor having a first current carrying electrode coupled to the second end of the second sense line, a second current carrying electrode coupled for receiving the source of operating potential, and a control electrode;
a third decoding transistor having a first current carrying electrode coupled to the second end of the third sense line, a second current carrying electrode coupled for receiving the source of operating potential, and a control electrode coupled to the control electrode of the first decoding transistor; and a fourth decoding transistor having a first current carrying electrode coupled to the second end of the fourth sense line, a second current carrying electrode coupled for receiving the source of operating potential, and a control electrode coupled to the control electrode of the second decoding transistor.

* * * * *